(12) United States Patent
Bhave et al.

(10) Patent No.: US 7,364,835 B2
(45) Date of Patent: Apr. 29, 2008

(54) DEVELOPER-SOLUBLE MATERIALS AND METHODS OF USING THE SAME IN VIA-FIRST DUAL DAMASCENE APPLICATIONS

(75) Inventors: Mandar Bhave, Austin, TX (US); Carlton A. Washburn, Rolla, MO (US); Rama Puligadda, Rolla, MO (US); Kevin Edwards, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 162 days.

(21) Appl. No.: 10/966,909

(22) Filed: Oct. 15, 2004

(65) Prior Publication Data
US 2005/0148170 A1    Jul. 7, 2005

Related U.S. Application Data

(60) Provisional application No. 60/511,762, filed on Oct. 15, 2003.

(51) Int. Cl.
*G03C 5/00*    (2006.01)
*G03F 7/00*    (2006.01)
(52) U.S. Cl. .................. 430/311; 430/313; 430/270.1; 430/273.1; 430/330; 438/690; 438/691
(58) Field of Classification Search ............. 430/270.1, 430/273.1, 311, 313, 330; 438/690, 691
See application file for complete search history.

(56) References Cited

U.S. PATENT DOCUMENTS 3,615,615 A    10/1971    Lincoln et al.
3,856,751 A    12/1974    Wilson
4,175,175 A    11/1979    Johnson et al.

(Continued)

FOREIGN PATENT DOCUMENTS

GB    2 288 184    11/1995

(Continued)

OTHER PUBLICATIONS

English languageabstract of JP 2003-183387.*

(Continued)

*Primary Examiner*—Amanda C. Walke
(74) *Attorney, Agent, or Firm*—Hovey Williams LLP

(57) ABSTRACT

Wet-recess (develop) gap-fill and bottom anti-reflective coatings based on a polyamic acid or polyester platform are provided. The polyamic acid platform allows imidization to form a polyimide when supplied with thermal energy. The gap-fill and bottom anti-reflective coatings are soluble in standard aqueous developers, and are useful for patterning via holes and trenches on semiconductor substrates in a dual damascene patterning scheme. In one embodiment, compositions composed of polyamic acids can be used as gap-filling (via-filling) materials having no anti-reflective function in a copper dual damascene process to improve iso-dense fill bias across different via arrays. In another embodiment, the same composition can be used for anti-reflective purposes, wherein the photoresist can be directly coated over the recessed surface, while it also acts as a fill material to planarize via holes on the substrate. The compositions described here are particularly suitable for use at exposure wavelengths of less than about 370 nm.

36 Claims, 3 Drawing Sheets

U.S. PATENT DOCUMENTS

| | | | |
|---|---|---|---|
| 4,244,799 A | 1/1981 | Fraser et al. | |
| 4,320,224 A | 3/1982 | Rose et al. | |
| 4,369,090 A | 1/1983 | Wilson et al. | |
| 4,683,024 A | 7/1987 | Miller et al. | |
| 4,732,841 A | 3/1988 | Radigan | |
| 4,738,916 A | 4/1988 | Namatsu et al. | |
| 4,742,152 A | 5/1988 | Scola | |
| 4,803,147 A | 2/1989 | Mueller et al. | |
| 4,891,303 A | 1/1990 | Garza et al. | |
| 4,910,122 A | 3/1990 | Arnold et al. | |
| 4,927,736 A | 5/1990 | Mueller et al. | |
| 4,996,247 A | 2/1991 | Nelson et al. | |
| 5,057,399 A | 10/1991 | Flaim et al. | |
| 5,089,593 A | 2/1992 | Fjare et al. | |
| 5,091,047 A | 2/1992 | Cleeves et al. | |
| 5,106,718 A | 4/1992 | Bartmann et al. | |
| 5,126,231 A | 6/1992 | Levy | |
| 5,304,626 A | 4/1994 | Burgess et al. | |
| 5,370,969 A | 12/1994 | Vidusek | |
| 5,397,684 A | 3/1995 | Hogan et al. | |
| 5,403,438 A | 4/1995 | Motoyama | |
| 5,542,971 A | 8/1996 | Auslander et al. | |
| 5,554,473 A | 9/1996 | Cais et al. | |
| 5,607,824 A | 3/1997 | Fahey et al. | |
| 5,632,910 A | 5/1997 | Nagayama et al. | |
| 5,688,987 A | 11/1997 | Meador et al. | |
| 5,691,101 A | 11/1997 | Ushirogouchi et al. | |
| 5,739,254 A | 4/1998 | Fuller et al. | |
| 5,772,925 A | 6/1998 | Watanabe et al. | |
| 5,892,096 A | 4/1999 | Meador et al. | |
| 5,925,578 A | 7/1999 | Bae | |
| 5,952,448 A | 9/1999 | Lee et al. | |
| 5,998,569 A | 12/1999 | Hogan et al. | |
| 6,015,650 A | 1/2000 | Bae | |
| 6,020,269 A | 2/2000 | Wang et al. | |
| 6,046,112 A * | 4/2000 | Wang | 438/693 |
| 6,054,254 A | 4/2000 | Sato et al. | |
| 6,071,662 A | 6/2000 | Carmichael et al. | |
| 6,110,653 A | 8/2000 | Holmes et al. | |
| 6,127,070 A | 10/2000 | Yang et al. | |
| 6,136,511 A | 10/2000 | Reinberg et al. | |
| 6,136,679 A | 10/2000 | Yu et al. | |
| 6,156,658 A | 12/2000 | Wang et al. | |
| 6,156,665 A | 12/2000 | Hamm et al. | |
| 6,165,695 A | 12/2000 | Yang et al. | |
| 6,171,763 B1 | 1/2001 | Wang et al. | |
| 6,200,907 B1 | 3/2001 | Wang et al. | |
| 6,218,292 B1 | 4/2001 | Foote | |
| 6,251,562 B1 | 6/2001 | Breyta et al. | |
| 6,306,560 B1 | 10/2001 | Wang et al. | |
| 6,309,789 B1 | 10/2001 | Takano et al. | |
| 6,309,926 B1 | 10/2001 | Bell et al. | |
| 6,319,649 B1 | 11/2001 | Kato et al. | |
| 6,319,651 B1 | 11/2001 | Holmes et al. | |
| 6,338,936 B1 | 1/2002 | Ichikawa et al. | |
| 6,359,028 B1 | 3/2002 | Miya et al. | |
| 6,361,833 B1 | 3/2002 | Nakada et al. | |
| 6,380,611 B1 | 4/2002 | Yin et al. | |
| 6,391,472 B1 | 5/2002 | Lamb | |
| 6,440,640 B1 | 8/2002 | Yang et al. | |
| 6,451,498 B1 | 9/2002 | Pirri et al. | |
| 6,455,416 B1 * | 9/2002 | Subramanian et al. | 438/636 |
| 6,458,705 B1 | 10/2002 | Hung et al. | |
| 6,487,879 B1 | 12/2002 | Blackwell et al. | |
| 6,488,509 B1 | 12/2002 | Ho et al. | |
| 6,509,137 B1 | 1/2003 | Wang et al. | |
| 6,576,409 B2 | 6/2003 | Ichikawa et al. | |
| 6,586,560 B1 | 7/2003 | Chen et al. | |
| 6,638,853 B1 * | 10/2003 | Sue et al. | 438/633 |
| 6,680,252 B2 * | 1/2004 | Chen et al. | 438/691 |
| 6,709,979 B2 * | 3/2004 | Komai et al. | 438/678 |
| 6,740,469 B2 | 5/2004 | Krishnamurthy et al. | |
| 6,838,223 B2 | 1/2005 | Yoon et al. | |
| 6,844,131 B2 | 1/2005 | Oberlander et al. | |
| 6,849,293 B2 * | 2/2005 | Rawat | 427/96.1 |
| 6,872,506 B2 | 3/2005 | Neef et al. | |
| 6,893,702 B2 * | 5/2005 | Takahashi | 419/37 |
| 6,924,228 B2 * | 8/2005 | Kim et al. | 438/636 |
| 6,976,904 B2 * | 12/2005 | Li et al. | 451/28 |
| 7,265,431 B2 | 9/2007 | Sivakumar | |
| 2002/0009599 A1 | 1/2002 | Welch et al. | |
| 2002/0183426 A1* | 12/2002 | Lamb et al. | 524/236 |
| 2003/0040179 A1 | 2/2003 | Thakar et al. | |
| 2003/0122269 A1 | 7/2003 | Weber et al. | |
| 2003/0129531 A1 | 7/2003 | Oberlander et al. | |
| 2003/0129547 A1 | 7/2003 | Neisser et al. | |
| 2003/0143404 A1 | 7/2003 | Welch et al. | |
| 2003/0166828 A1 | 9/2003 | Cox et al. | |
| 2003/0194636 A1 | 10/2003 | Wanat et al. | |
| 2003/0215736 A1 | 11/2003 | Oberlander et al. | |
| 2004/0018451 A1 | 1/2004 | Choi | |
| 2004/0058275 A1 | 3/2004 | Neef et al. | |
| 2004/0077173 A1 | 4/2004 | Sivakumar | |
| 2004/0210034 A1 | 10/2004 | Cox et al. | |
| 2004/0219456 A1 | 11/2004 | Guerrero et al. | |
| 2004/0220379 A1* | 11/2004 | Park et al. | 528/353 |
| 2005/0074699 A1 | 4/2005 | Sun et al. | |

FOREIGN PATENT DOCUMENTS

| | | |
|---|---|---|
| JP | 48000891 | 1/1973 |
| JP | 10149531 | 6/1998 |
| JP | 10307394 | 11/1998 |
| JP | 2003183387 A * | 7/2003 |
| WO | WO 2004/113417 A1 | 12/2004 |

OTHER PUBLICATIONS

"Synthesis and Characterizations of Photodefinable Polycarbonates for Use as Sacrificial Materials in the Fabrication of Microfludic Devices," White et al., School of Chemical Engineering, Georgia Institute of Technology, Atlanta, GA 30332-0100.

"Removable Organic Antireflective Coating", Sturtevant et al., S.P.I.E., vol. 2724, pp. 738-746 (1996).

"Compatibility of Chemically Amplified Photoresists with Bottom Anti-Reflective Coatings," Yoshino et al., S.P.I.E., vol. 3333, pp. 655-661 (1998).

"Limits of Ultrathin Resist Processes," Okoroanyanwu, Future Fab Intl., Sep. 2003.

Translated Abstract of JP Pub No. JP 48000891.

Translation of JP Pub No. JP 10307394.

Translation of JP Pub No. JP 10-149531.

"Aqueous Processable Positive and Negative Tone Photoresists," Willson Research Group, The University of Texas at Austin, Apr. 18, 2001, http://willson.cm.utexas.edu/Research/Sub_Files/Water_Soluble/.

* cited by examiner

DEVELOPER-SOLUBLE MATERIALS AND METHODS OF USING THE SAME IN VIA-FIRST DUAL DAMASCENE APPLICATIONS

RELATED APPLICATIONS

This application claims the priority benefit of a provisional application entitled WET-DEVELOP (RECESS) MATERIALS BASED ON POLYAMIC ACIDS FOR VIA-FIRST DUAL DAMASCENE APPLICATIONS, Ser. No. 60/511,762, filed Oct. 15, 2003, incorporated by reference herein.

BACKGROUND OF THE INVENTION

1. Field of the Invention

The present invention is concerned with new dual damascene methods utilizing a developer solution contact step after baking of a gap-fill or anti-reflective composition and prior to application of a photoresist layer. These methods result in cured layers having low biases, even on highly topographic surfaces.

2. Description of the Prior Art

As integrated circuit devices grow smaller, there is an increasing need for multi-level interconnects of smaller size and improved feature integrity. The damascene integration scheme is one way to allow for increasing chip densities on a substrate as design rules continue to shrink integrated circuit devices. The damascene process eliminates the need to etch the metal layer that provides the interconnections, permits more densely spaced interconnects, and eliminates the need for dielectric gap-fill materials.

There are two general classes of damascene processes: single damascene and dual damascene. The single damascene process fabricates interconnections by forming a conducting plug through a dielectric layer to connect to the underlying conducting layer. Another dielectric layer is then formed, with the actual interconnect wiring metallization being patterned in the second layer. The dual damascene process constructs multi-level interconnects of smaller size than the single damascene process. The via and trench patterns are patterned into a single dielectric layer and then filled in one step with a conducting material such as a metal. Dual damascene processes involve fewer steps, resulting in smaller, more complex integrated circuit devices, thus lowering manufacturing complexity and cost.

Despite the advantages of dual damascene processes, patterning and etch processes are made more difficult because of feature topography and more complex stack layers. Several techniques have been developed to address such problems, including self-aligned dual damascene, trench-first dual damascene, and via-first dual damascene processes. The application of self-aligned dual damascene is limited, because it requires a thick, intermediate layer to act as an anti-reflective layer, nearly perfect trench and via alignment, and very high etch selectivity between the dielectric and etch-stop layers. Trench-first dual damascene processes involve first masking and etching the trench, and then aligning the via pattern with the newly etched trenches. Successful trench-first dual damascene processes require achieving very uniform trenches and maintaining critical dimension control of vias, which in turn requires high etch selectivity between the dielectric and etch-stop layers. The use of etch-stop layers may also increase the dielectric constant of the dielectric material, possibly leading to device failure.

Via-first dual damascene is a somewhat simpler technique, because the vias are formed on top of the full stack of layers. The vias are etched, followed by lithography processes to form the trench patterns. Via-first dual damascene requires a fill composition capable of protecting the bottom of the via during the trench etch step, and of planarizing the surface to allow easier trench patterning. Two techniques are commonly used in via-first dual damascene processes: partial fill and full fill. In partial fill processes, the gap-fill material protects only the bottoms of the via holes, requiring consistent coverage and depth control. In full-fill processes, the vias are completely filled and the layer is planarized. The etching process is performed on the top layer. During photoresist patterning steps, it is necessary to control reflections from underlying materials through use of an anti-reflective coating to prevent distortion of the photoresist pattern. If the gap-fill material lacks suitable light-absorbing properties, trench patterning usually requires incorporating an anti-reflective coating into the stack as a hardmask layer, or coating an anti-reflective layer over the gap-fill material before applying the photoresist. These extra layers complicate the process and increase manufacturing costs.

A typical via-first dual damascene process is illustrated in FIG. 1. A dielectric layer (10) is deposited onto a substrate (12) with a conductive layer (14). A gap-fill material without light-absorbing properties (16) has mostly filled the vias (17). A hardmask layer (18) and a bottom anti-reflective coating (20) are applied for reflection control for the patterned photoresist (22) to permit the trench to be etched into the dielectric layer (10).

Using a gap-fill material with good light-absorption and planarizing properties would simplify the process, but conventional organic bottom anti-reflective coatings do not display these properties. Coating properties of bottom anti-reflective coatings vary based on feature density and size. Differences in feature density result in iso-dense bias, in which the depth of the bottom anti-reflective coating is greater in isolated device features than in dense device features. The use of very thick bottom anti-reflective coatings addresses this problem, but requires a troublesome blanket-etch step to planarize the layer and reduce its thickness to more useful levels before the photoresist layer can be applied and patterned. This requires additional manufacturing steps, and may require wafers to be transferred between the etch and lithography bays during manufacturing. Thick coatings also require a high etch selectivity between the photoresist and the bottom anti-reflective coating, which may not be possible because of the etch chemistry or the photoresist and bottom anti-reflective coating chemistries. FIG. 2 shows a dielectric layer (24) with via openings (26) formed over a substrate (28) with a conductive layer (30) that has been coated with a conventional, gap-fill, bottom anti-reflective coating (32). FIG. 2 illustrates the poor fill in the dense areas, nonuniform fill (34), and voids in the bottom anti-reflective coating (36).

Blanket etch steps can also leave debris remaining in device features after etching steps, which can lead to poor electrical connections and device failure. Removal of such debris may require the use of time-consuming, wet-cleaning techniques, and despite this, debris may still remain. Thick bottom anti-reflective coatings can also result in a fence problem in trenches and vias. The bottom anti-reflective coating and the dielectric material undergo a chemical reaction when in contact with one another, forming a thin residue inside the vias. The residue can cause incomplete trench etch, leading to poor device feature integrity. In view of the difficulties in the via-first dual damascene process, a method of using bottom anti-reflective coatings that would reduce the number of steps required in fabrication, eliminate the debris and the fence problems, and result in a more consistent fill of dense and isolated device features is greatly needed.

SUMMARY OF THE INVENTION

The present invention is broadly concerned with new methods of forming dual damascene structures. The inventive methods comprise applying (e.g., by spin coating) a composition to a substrate so as to form a layer of that composition on the substrate surface. The composition layer is then baked, and a developer is puddled on the cured layer so as to remove (recess) at least some of the layer. The developer is removed (e.g., by spinning) from the cured layer, and the layer structure is further processed as necessary for its intended final use.

In more detail, the substrate utilized will preferably include topography (e.g., contact holes, via holes, raised features, trenches). This topography can be included directly on the substrate surface, or it can be included in one or more layers of other material formed on the substrate surface. The substrate can be any microelectronic substrate. Preferred substrates include those commonly used in dual damascene structures, with particularly preferred substrates being selected from the group consisting of silicon, aluminum, tungsten, tungsten silicide, gallium arsenide, germanium, tantalum, tantalum nitride, and SiGe.

The composition utilized can be any suitable crosslinking composition, including conventional anti-reflective coating and/or gap-fill compositions. This composition can be applied to the substrate at any number of average thicknesses depending upon the final use, but will typically be initially applied at thicknesses of from about 150-600 nm. It's preferred that the composition be applied to the substrate in sufficient quantities to substantially planarize the substrate surface.

The composition comprises a polymer dispersed or dissolved in a solvent system. Preferred polymers include polyesters and polyamic acids, with the preferred polyamic acids including recurring monomers having the formulas

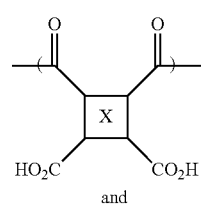

(I)

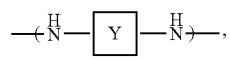

(II)

where each of $X$ and $Y$ is individually selected from the group consisting of aryl and aliphatic groups.

Preferred X and Y groups include those selected from the group consisting of substituted and unsubstituted phenyl, biphenyl, naphthyl, and anthryl groups, and substituted and unsubstituted $C_1$-$C_{12}$ aliphatic (preferably alkyl) groups.

The polyamic acids can be formed by polymerizing a dianhydride with a diamine in the presence of a solvent system and a catalyst. Preferred dianhydrides have the formula

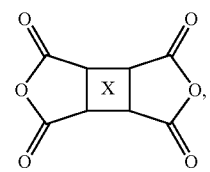

while preferred diamines have the formula

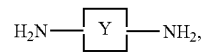

where X and Y are as defined above.

The most preferred polyamic acids for use in the present invention comprise recurring monomers selected from the group consisting of

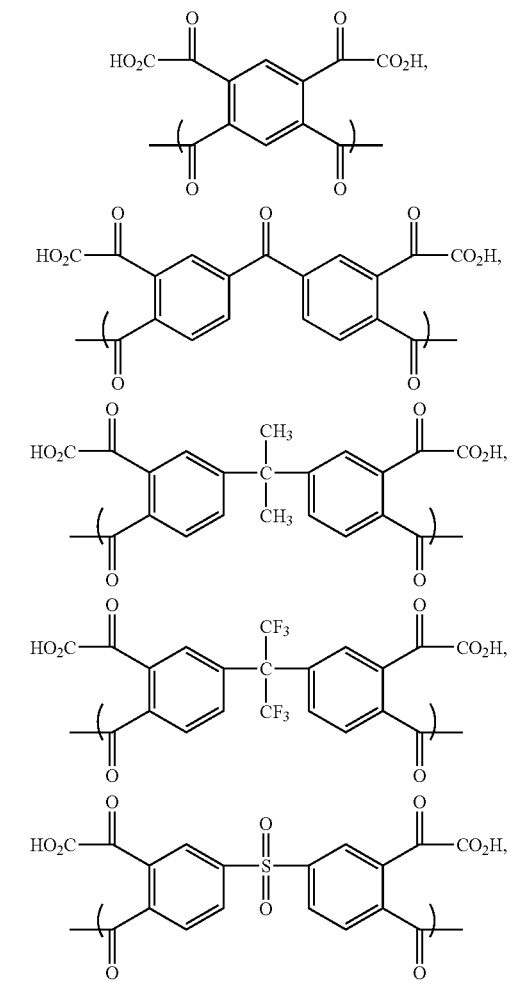

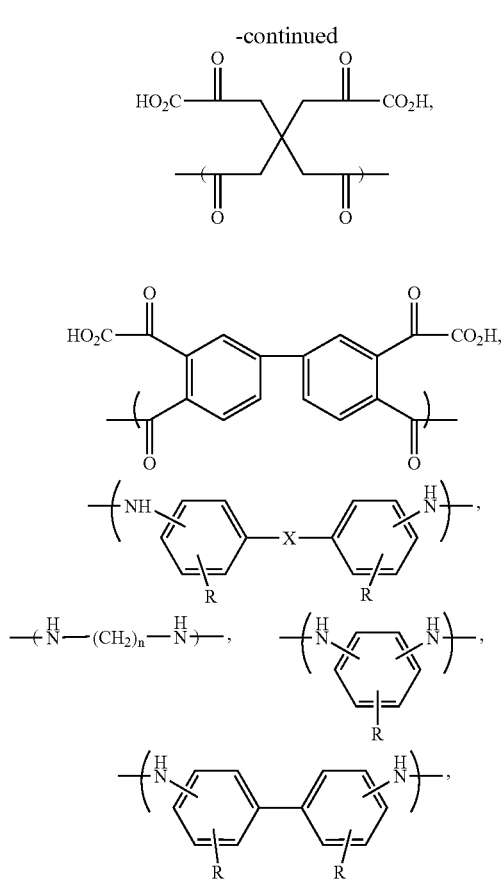

where:

X is selected from the group consisting of —O—, —S—, —CH$_2$—, —C(CF$_3$)$_2$—, and —C(CH$_3$)$_2$—;

n is 2-8; and each R is individually selected from the group consisting of —H and —OH.

One preferred monomer has the formula

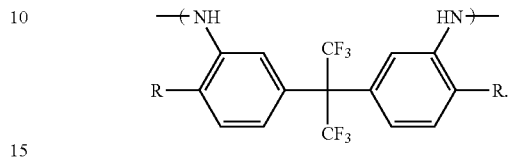

In one preferred embodiment, the polymer comprises an endcap monomer at one of its termini, and even more preferably at both of its termini. The endcap monomer will have a formula other than (I) or (II) above, and it will comprise functional groups that are less reactive at room temperature than the those of the other monomers within the polymer, thus reducing room temperature reactions. Particularly preferred endcap monomers have the formula

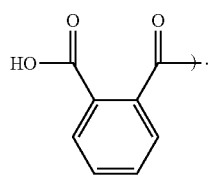

Scheme A shows one example of how such an endcap monomer can be added to the polymer.

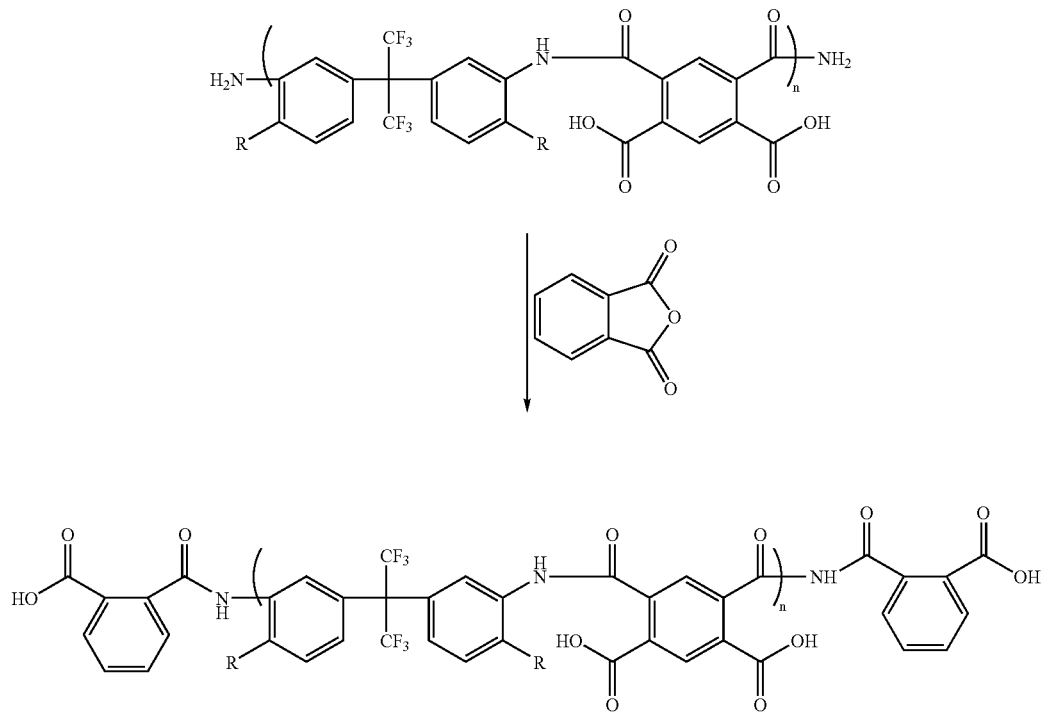

Regardless of the embodiment, the compositions are formed by simply dispersing or dissolving the polymers in the solvent system, preferably at ambient conditions and for a sufficient amount of time to form a substantially homogeneous dispersion. The polymer should be present in the composition at a level of 1-40% by weight, more preferably from about 5-25% by weight, and even more preferably from about 5-15% by weight, based upon the total weight of solids in the composition taken as 100% by weight. The weight average molecular weight of this polymer is preferably from about 1,000-1,000,000 Daltons, and more preferably from about 10,000-100,000 Daltons.

Preferred solvent systems include a solvent selected from the group consisting of propylene glycol methyl ether acetate (PGMEA), propylene glycol methyl ether (PGME), ethyl lactate, and mixtures thereof. The solvent system should have a boiling point of from about 50-250° C., and more preferably from about 150-200° C., and should be utilized at a level of from about 80-98% by weight, preferably from about 80-95% by weight, and even more preferably from about 85-92% by weight, based upon the total weight of the composition taken as 100% by weight. Thus, the percent solids in the composition will be from about 2-20% by weight, preferably from about 5-20% by weight, and more preferably from about 8-15% by weight, based upon the total weight of the composition taken as 100% by weight.

Any other ingredients should be dissolved or dispersed in the solvent system along with the polymer. One such ingredient is a crosslinking agent. Preferred crosslinking agents include aminoplasts (e.g., POWDERLINK 1174, CYMEL, both from Cytec Industries), multi-functional epoxies (e.g., CY179MA from Vantico, MY720 from Ciba-Geigy), and cyanurates (triepoxy propyl isocyanurate). The crosslinking agent is preferably present in the composition at a level of from about 0-70% by weight, preferably from about 1-30% by weight, and more preferably from about 1-10% by weight, based upon the total weight of polymer solids in the composition taken as 100% by weight. Thus, the compositions of the invention should crosslink at a temperature of from about 100-250° C., and more preferably from about 150-200° C.

In one embodiment, it is preferred that the compositions also include a light attenuating compound or moiety (also referred to as a chromophore or dye). The light attenuating compound could be chemically attached to a polymer, or it could simply be blended into the polymer solution. The chemical technique to attach the light attenuating compound involves reacting the light attenuating compound (containing at least one or more pendant carboxylic acid or phenol functional groups) with an epoxy or a multifunctional epoxy compound.

If used, the light attenuating compound or moiety should be present in the composition at a level of from about 1-10% by weight, and preferably from about 2-6% by weight, based upon the total weight of solids in the composition taken as 100% by weight. The light attenuating compound is selected based upon the wavelength at which the compositions will be processed. Thus, at wavelengths of 248 nm, preferred light attenuating compounds or moieties include napthalenes and anthracenes, with 3,7-dihydroxy-2-napthoic acid being particularly preferred. At wavelengths of 193 nm, preferred light attenuating compounds or moieties include phenyl or biphenyl (aromatic or substituted aromatic rings) compounds. Particularly preferred light attenuating compounds include the following compounds (as well as functional moieties of those compounds):

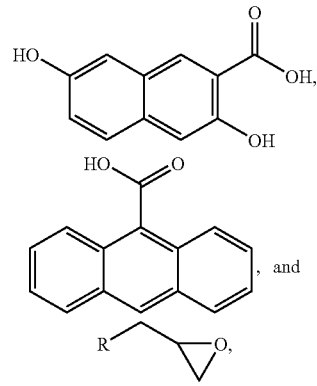

where R is selected from the group consisting of cyclic (including heterocyclic rings such as cyanuric rings) and aliphatic groups. Aliphatic groups include both cyclic (preferably $C_3$-$C_{12}$) and branched and unbranched alkyls (preferably $C_1$-$C_{12}$).

It will be appreciated that a number of other optional ingredients can be included in the compositions as well. Typical optional ingredients include surfactants, catalysts, and adhesion promoters.

After application to the substrate, the composition is baked or cured. The baking temperatures and times affect the degree of imidization of the polyamic acid, and therefore the amount of film remaining after contacting the composition with a developer. It is preferred that the degree imidization (i.e., the conversion of polyamic acid to polyimide) after baking be at least about 20 greater, and preferably from about 30-90 greater than the degree of imidization prior to baking. This is generally accomplished by heating at a temperature of from about 130-230° C., and preferably from about 150-210° C. This heating step is preferably carried out for a time period of from about 30-120 seconds, and more preferably from about 45-90 seconds.

Next, a developer is puddled onto the layer. The developer is preferably a commercially available aqueous developer comprising a base. Particularly preferred developers include those selected from the group consisting of tetramethyl ammonium hydroxide, potassium hydroxide, sodium hydroxide, and mixtures thereof. The developer is preferably allowed to contact the layer for a time period of from about 30-90 seconds, more preferably from about 45-80 seconds, and even more preferably for about 55-65 seconds. The developer is then removed from the substrate, preferably by spinning at a speed of from about 1,500-2,500 rpm for a time period of from about 20-40 seconds.

When comparing the thickness of the layer prior to developer contact to the thickness of the layer after developer contact, it can be seen that the developer contact step results in the composition being at least partially removed. Preferably, the developer contact step removes or recesses the composition at a rate of from about 1-500 Å of thickness per second of developer contact, more preferably from about 10-300 Å of thickness per second of developer contact, and even more preferably from about 20-200 Å of thickness per second of developer contact. The amount of recess can be to a level above, at, or below the upper edge of the vias, depending upon the application. If the material is recessed to a point above the upper edge of the vias, the remaining film can be used as an anti-reflective layer at its first or second reflective minimum thickness. If the material is recessed to a level at or below the upper edge of the vias, the material will act only as a gap-filling material, and another anti-reflective coating layer is preferably applied to suppress light reflecting from the substrate. Having the material recessed to partially fill the vias can be advantageous because less bottom anti-reflective coating must be etched. Minimization of the material that must be etched in the vias results in reduced fencing or crown formation after trench etch. Fences or crowns are bottom anti-reflective coating or dielectric residue that remains after the trench etch because of poor etch selectivity between the via-fill, bottom anti-reflective coating and the interlayer dielectric.

The inventive process can be used in both partial fill (i.e., where about 35-65% of the hole's depth is filled with the composition) and full-fill (i.e., where at least about 95%, and preferably about 100% of the hole's depth is filled with the composition) applications. Furthermore, it will be appreciated that the inventive methods can be used to form dual damascene structures possessing properties not previously achieved. For example, the structures prepared according to the inventive methods will have low biases, even with very thin layers of the composition. Specifically, the inventive methods will result in layers having biases of less than about 20 nm, preferably less than about 10 nm, and more preferably from about 0-5 nm, even at average film thicknesses of less than about 200 nm.

As used herein, the average thickness of a layer is determined by measuring (with an ellipsometer or other conventional device) the thickness of a layer at a point about halfway between two via holes: (1) that are not separated from one another by an intervening feature; and (2) whose boundaries are within 1,000 nm of one another. These measurements are repeated over a wafer (or other area as defined herein) up to 49 times, and the measurements are averaged to determine the average thickness of a layer.

As used herein, the bias is determined by subtracting the average thickness of a layer over a dense region from the average thickness of that same layer over an isolated region. A dense region is defined as a portion of a substrate that has at least about 50% of its surface area filled with via holes, while an isolated region is defined as a portion of a substrate that has less than about 20% of its surface area filled with via holes.

A photoresist layer can then be applied to the recessed composition (or to an anti-reflective coating applied on the recessed composition), with the photoresist layer being patterned according to conventional processes (e.g., exposure to activating radiation at the wavelength of interest, developing the exposed photoresist). Since the inventive method is particularly well-suited for via first methods, this patterning step will typically involve patterning the desired trenches, follow by etching (e.g., plasm etching) of those trenches into the substrate. It will be appreciated that this method is particularly advantageous over the prior art because it is compatible with copper-containing circuits, while avoiding the issues typically encountered with methods where etching of copper is required.

DETAILED DESCRIPTION OF THE PREFERRED EMBODIMENTS

EXAMPLES

Figure 1:
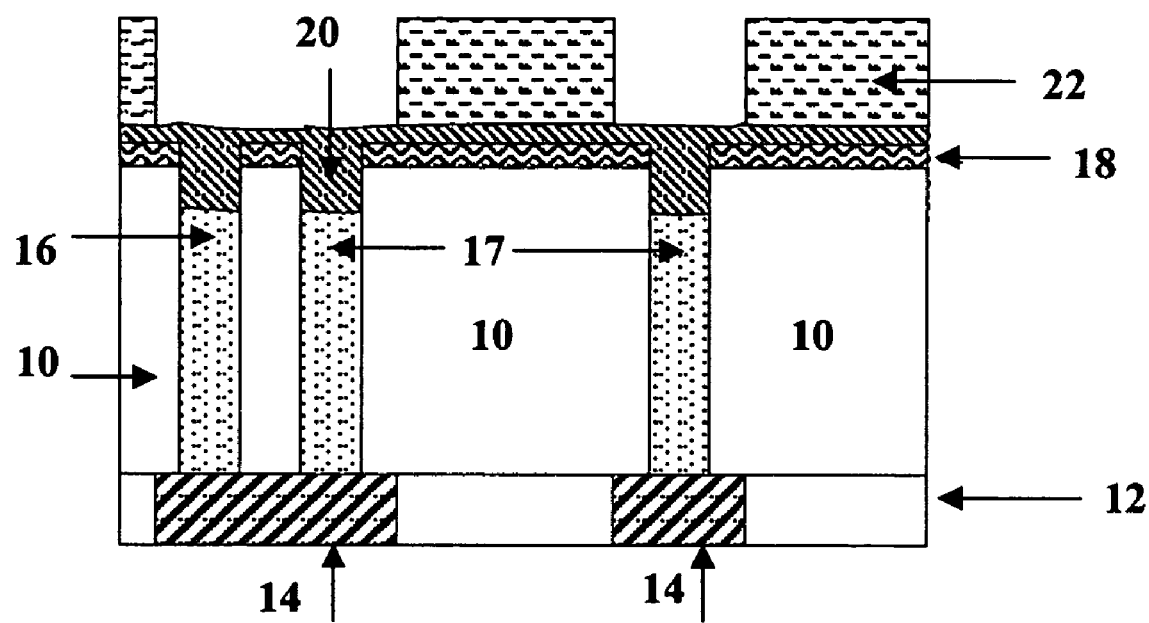
FIG. 1 is a schematic drawing showing prior art, via-first, dual damascene layers using a gap-fill material without light-absorbing properties.
Figure 2:
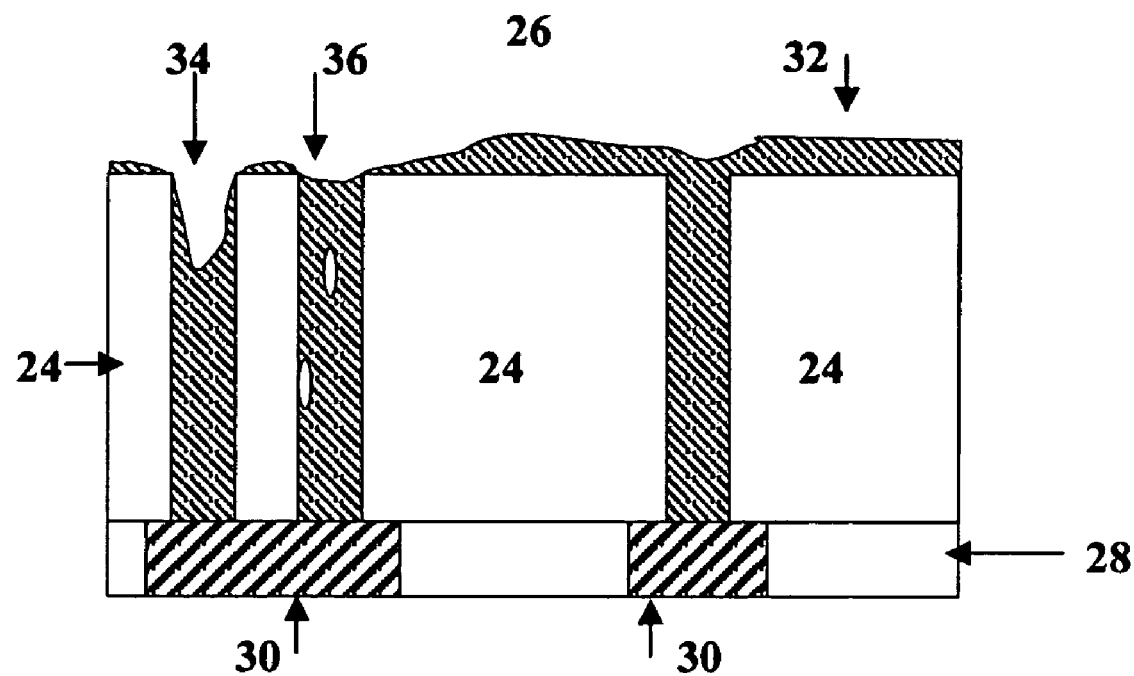
FIG. 2 is a schematic drawing illustrating the gap-fill properties of prior art organic bottom anti-reflective coatings.

The following examples set forth preferred methods in accordance with the invention. It is to be understood, however, that these examples are provided by way of illustration and nothing therein should be taken as a limitation upon the overall scope of the invention.

Material Preparation

1. Preparation of Polymer Mother Liquor

To make the compositions used in these examples, a polymer mother liquor and a dye solution were first prepared. The polymer mother liquor was prepared by mixing, in the order listed, the following reagents:

39.46 g of 2,2-bis(3-amino-4-hydroxyphenyl) hexafluoropropane (Bis-AP-AF; obtained from ChrisKev Corp.);

1.24 g of 3,3'-dihydroxy-4,4'-aminobenzidine (HAB; obtained from ChrisKev Corp.);

500 g of propylene glycol monomethyl ether (PGME; obtained from Harcross Corp.);

25 g of pyromellitic dianhydride (PMDA; obtained from ChrisKev Corp.); and 91.3 g of PGME.

Here are the monomers used for this polymer, along with the respective molar ratios of these monomers:

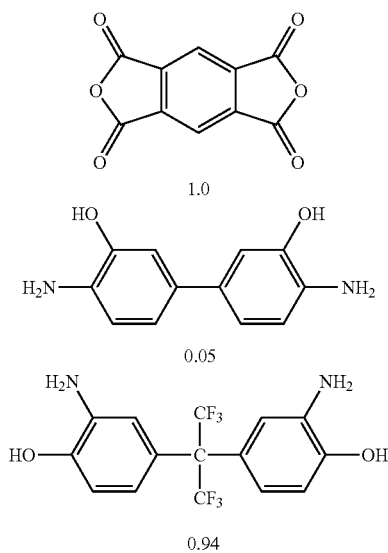

The Bis-AP-AF and the HAB were added to a 1-liter, round-bottom flask. The 500 g of PGME were added to the diamines. The mixture was stirred until all of the Bis-AP-AF was in solution, and the HAB was broken into a fine, suspended powder. The mixture was then heated to 60° C. using a silicone oil bath. The PMDA was added, and the addition funnel and flask walls were rinsed with the remaining PGME. The flask was then sealed, and the monomers were allowed to react for 24 hours in a nitrogen atmosphere. After 24 hours, the polymer solution was cooled to room temperature, filtered through a 0.45-μm endpoint filter, and bottled in a 1-liter Nalgene® bottle.

2. Preparation of Dye Solution

The dye solution was prepared by mixing the following reagents in a 250-ml flask:
- 7.25 g of triglycidyl epoxy propyl cyanurate (TEPIC; obtained from Aldrich Chemical Corp.);
- 13.33 g of 3,7-dihydroxy napthoic acid (obtained from Aldrich Chemical Corp.);
- 7.25 g of 9-anthracene carboxylic acid (obtained from TCI Chemicals Ltd.);
- 0.56 g of benzyl triethyl ammonium chloride (BTEAC; obtained from Aldrich Chemical Corp.); and
- 122.32 g of PGME.

Example 1

Preparation of Slower-Developing, Acetal Photoresist-Compatible Composition

The composition of this example was made by mixing the following ingredients together:
- 55.0 g of the polymer solution prepared above (5.5 g polymer solids and 49.5 g PGME);
- 16.5 g of the dye solution prepared above (3.3 g dye solids and 13.2 g PGME);
- 1.67 g of MY720 (Ciba-Geigy);
- 21.57 g of PGME; and
- 36.12 g of PGMEA.

The total weight of the composition mixture was 130.86 g, with 8% solids.

The composition was spin applied at 1,500 rpm for 60 seconds onto silicon wafers and then baked at 175° C. for 60 seconds using a proximity bake plate. The film thickness of the coating was measured using an ellipsometer. The thickness range was from 290 to 300 nm across a 200-mm silicon wafer. The optical properties (n and k values) were determined using a J. A. Woollam variable angle spectroscopic ellipsometer (VASE). The optical properties of the film at a wavelength of 248 nm were n=1.74 and k=0.4. At a wavelength of 193 nm, n was 1.5, and k was 0.45.

This composition was also spin applied on substrates having via holes ranging in size from 0.1 to 0.3 μm. The composition was spun on at 1,000 rpm for 10 seconds followed by 1,500 rpm for 30 to 50 seconds. The film was then baked on a proximity hotplate at a temperature of 180° C. for a time period of 60 seconds.

The via holes were completely planarized after the composition was spin coated onto the substrate. The thickness of the composition ranged from 100 nm to 600 nm depending on the size and density of via holes present on the substrate.

A standard 0.26N TMAH developer was puddled on the substrate for 60 seconds and then spun off. The wafer was then rinsed with deionized water, and the wafer was baked at 100° C. for 10 seconds to remove any residual water from the surface of the substrate.

Figure 3:
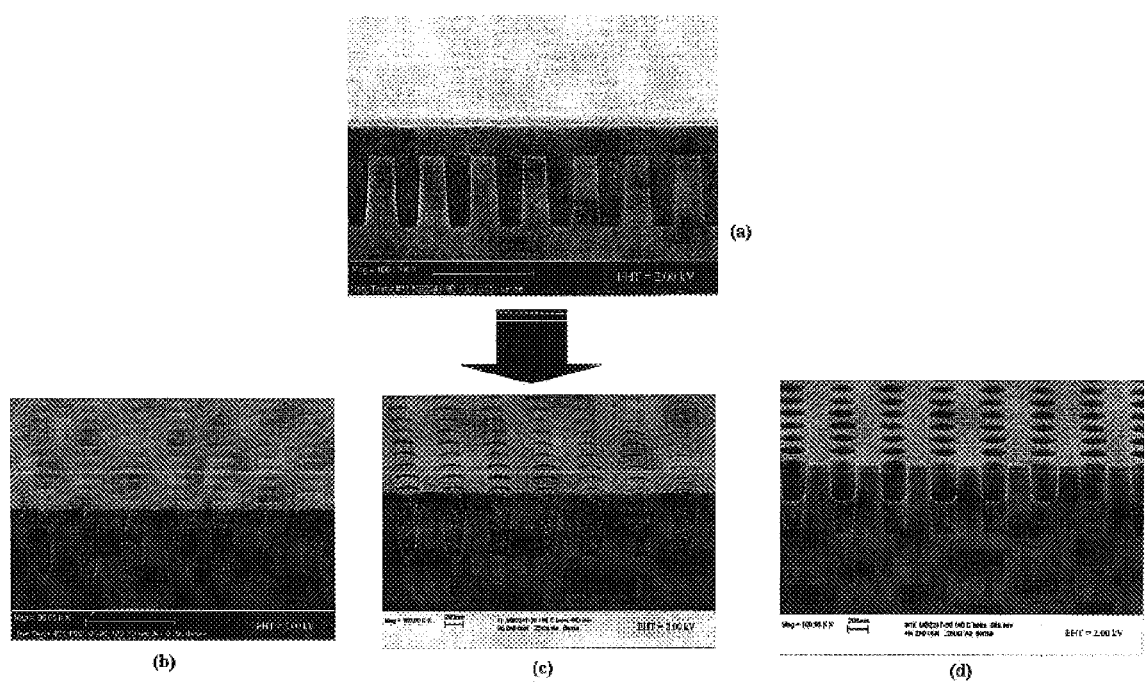
FIG. 3 is a scanning electron microscope (SEM) photograph showing the different recess levels used with the inventive method described in Example 1.

The substrates (ones that were only coated with the composition and others that had gone through a development process) were then cross-sectioned and examined using a scanning electron microscope. FIG. 3 shows a set of examples using the composition of this example where the substrate contained via holes that were 0.25 μm in diameter and 0.7 μm deep. FIG. 3(a) shows a sample prior to the wet recess process. FIG. 3(b) shows a sample that was baked at 180° C. for 60 seconds, followed by recessing of the composition to the second reflectivity minimum thickness of the composition. FIG. 3(c) shows a sample that was baked at 180° C. for 60 seconds, followed by recessing for 60 seconds to the via surface. FIG. 3(d) shows a sample that was baked at 140° C. for 60 seconds, followed by recessing for 30 seconds so that the composition was recessed to below the upper edge of the via holes (for partial fill).

Example 2

Preparation of Faster-Developing, ESCAP Photoresist-Compatible Composition

This composition was prepared by mixing the following ingredients:
- 24.0 g of the polymer solution prepared above (2.4 g of polymer solids, 21.6 g of PGME);
- 7.20 g of dye solution (1.44 g of solids, 5.76 g of PGME);
- 0.72 g of triepoxy propyl cyanurate (30% of polymer solids);
- 9.34 g of PGME; and
- 15.73 g of PGMEA.

The total weight of composition was 57.0 g, with 8% solids.

The composition was then spin coated, processed, and examined using the same methods described in Example 1. A proximity bake plate was used to bake the wafers.

Example 3

Preparation of Faster-Developing, ESCAP Photoresist-Compatible Composition

This composition was prepared by mixing the following ingredients:
- 12.0 g of the polymer solution prepared above (1.2 g of polymer solids, 10.8 g of PGME);
- 7.20 g of the dye solution prepared above (1.44 g of solids, 5.76 g of PGME);
- 0.4 g of CY179MA (33% of polymer solids; obtained from Vantico);
- 7.64 g of PGME; and
- 10.76 g of PGMEA.

The total weight of the composition was 38.0 g, with 8% solids.

The composition was then spin coated, processed, and examined using the same methods described in Example 1. A proximity bake plate was used to bake the wafers.

Optical Properties for Compositions of Examples 1-3

Tables I sets forth the n and k values at 193- and 248-nm wavelengths for the compositions described in Examples 1-3 above.

TABLE I

| Example | n (193 nm) | k (193 nm) | n (248 nm) | k (248 nm) |
|---|---|---|---|---|
| 1 | 1.45 | 0.45 | 1.76 | 0.42 |
| 2 | 1.46 | 0.47 | 1.73 | 0.4 |
| 3 | 1.45 | 0.44 | 1.75 | 0.43 |

Example 4

Preparation of Composition Using a Polyester Polymer

1. Preparation of Polymer Mother Liquor
   The following were mixed in a round-bottom flask:
   9.61 g of citric acid (obtained from Aldrich);
   13.91 g of EX721 (obtained from Nagase Chemicals);
   0.68 g of tetrabutylphosphonium bromide (obtained from Aldrich); and
   96.80 g of PGME.
   A nitrogen atmosphere was established, and the reaction was heated at 100° C. for 16 hours. The solution was allowed to cool to ambient temperature and bottled.

2. Preparation of Dye Solution
   A dye solution was prepared by adding the following reagents to a 100-ml, 3-neck, round-bottom flask equipped with nitrogen inlet, thermometer, condenser, and a stir bar:
   14.29 g of TEPIC (obtained from Nissan Chemical Industries);
   25.52 g of 3,7-dihydroxynaphthoic acid (obtained from Aldrich);
   0.214 g of imidazole (obtained Aldrich); and
   59.98 g of PGME.
   The reaction flask was immersed in an oil bath heated to 120° C. The reaction was stirred for 24 hours at reflux.
   Two formulations were prepared—one including the dye solution and one without the dye solution. The formulation without the dye solution was prepared by blending the following ingredients to form a homogeneous solution:
   10.0 g of the polymer mother liquor described in this example;
   1.4 g of N,N-diglycidyl-4-glycidyloxyanaline (obtained from Aldrich);
   3.45 g of PGME; and
   12.15 g of propylene glycol propyl ether (PnP; obtained from Harcross).
   This formulation was spin applied at 1,500 rpm for 60 seconds onto a silicon wafer containing via holes.
   The formulation including the dye solution was prepared by blending the following ingredients to form a homogeneous solution:
   10.0 g of the polymer mother liquor described in this example;
   1.4 g of N,N-diglycidyl-4-glycidyloxyanaline;
   3.75 g of the dye solution described in this example;
   3.45 g of PGME; and
   12.15 g of PnP.
   This formulation was spin applied at 1,500 rpm for 60 seconds onto a silicon wafer containing via holes.

Example 5

Preparation of Composition without a Dye (Gap-Fill Compositions)

1. Preparation of Polymer Mother Liquor
   The following ingredients were mixed in a round-bottom flask:
   22.35 g (0.0611 mole) of Bis-AP-AF; and
   96.96 g of PGME.
   The flask was then immersed in an oil bath maintained at 60° C. A water condenser was attached to the flask, and the contents of the flask were stirred using a magnetic stirrer.
   After the complete dissolution of Bis-AP-AF, 10.0 g (0.0458 mole) of PMDA were added to the solution. The reaction was stirred for 18 hours, and then 4.53 g (0.0305 mole) of phthalic anhydride (obtained from Aldrich) were added. The reaction was stirred at 60° C. for 3 hours and cooled to ambient temperature.

2. Preparation of Formulations
   Formulation (a)—The following reagents were combined:
   15 g of the polymer mother liquor prepared in this example;
   3.55 g of crosslinker CY179MA;
   28.56 g of PGME; and
   16.90 g of PGMEA.
   The reagents were stirred and then filtered through a 0.1-μm endpoint filter.
   Formulation (b)—The following reagents were combined:
   36.30 g of the polymer mother liquor prepared in this example;
   4.00 g of crosslinker MY720 (50% weight solution in PGME);
   33.30 g of PGME; and
   26.40 g of PGMEA.
   The reagents were stirred and then filtered through a 0.1-μm endpoint filter.
   Formulation (c)—The following reagents were combined:
   36.30 g of the polymer mother liquor prepared in this example;
   4.00 g of crosslinker DEN 438 (obtained from Araldite; 50% weight solution in PGME);
   33.30 g of PGME; and
   26.40 g of PGMEA.
   The reagents were stirred and then filtered through a 0.1-μm endpoint filter.
   Formulation (d)—The following reagents were combined:
   10 g of the polymer mother liquor prepared in this example;
   1.08 g of crosslinker MY720 (50% weight solution in PGME);
   0.54 g of trishydroxyphenyl ethane;
   11.56 g of PGME; and
   8.316 of PGMEA.
   The reagents were stirred and then filtered through a 0.1-μm endpoint filter.

Example 6

Preparation of Composition without a Dye (Gap-Fill Composition)

1. Preparation of Lower Molecular Weight, Polymer Mother Liquor
   The following ingredients were added to a round-bottom flask:
   10.0 g (0.0275 mole) of Bis-AP-AF; and
   96.96 g of PGME.
   The flask was then immersed in an oil bath maintained at 60° C. A water condenser was attached, and the contents of the flask were stirred using a magnetic stirrer. After complete dissolution of the Bis-AP-AF, 3.0 g (0.0137 mole) of pyromellitic dianhydride were added to the solution. The reaction was allowed to stir for 18 hours, and then 4.07 g (0.0275 mole) of phthalic anhydride were added. The reaction was stirred at 60° C. for 3 hours and cooled to ambient temperature.

2. Preparation of Formulation

The following reagents were combined:
- 36.30 g of the polymer mother liquor prepared in this example;
- 4.00 g of crosslinker MY720 (50% weight solution in PGME);
- 33.30 g of PGME; and
- 26.40 g of PGMEA.

The reagents were stirred and then filtered through a 0.1-μm endpoint filter.

We claim:

1. A method of preparing a dual damascene structure, said method comprising the steps of:
providing a substrate having a surface;
applying a composition to at least a portion of said surface;
baking said composition; and
contacting a developer with said composition so as to remove some of said composition,
wherein said developer is an aqueous solution comprising a base.

2. The method of claim 1, wherein said substrate is selected from the group consisting of silicon, aluminum, tungsten, tungsten silicide, gallium arsenide, germanium, tantalum, tantalum nitrite, and SiGe.

3. The method of claim 1, wherein said composition comprises a layer after said applying step, and said contacting step comprises puddling the developer on said layer.

4. The method of claim 1, wherein said contacting step comprises contacting the developer with said composition for a time period of from about 30-90 seconds.

5. The method of claim 1, wherein said developer is selected from the group consisting of tetramethyl ammonium hydroxide, potassium hydroxide, sodium hydroxide, and mixtures thereof.

6. The method of claim 1, wherein said composition comprises a layer having an average thickness prior to said contacting step, and said contacting step results in said layer being removed at a rate of from about 1-500 Å of thickness per second of developer contact.

7. The method of claim 1, wherein said composition comprises a polymer selected from the group consisting of polyesters and polyamic acids.

8. The method of claim 7, wherein said polymer is a polyamic acid having an initial degree of imidization prior to said baking step, and a second degree of imidization after said baking step, wherein said second degree of imidization is at least about 20 greater than said initial degree of imidization.

9. The method of claim 1, wherein said baking step comprises heating said composition at a temperature of from about 130-230° C.

10. The method of claim 1, wherein said baking step is carried out for a time period of from about 30-120 seconds.

11. The method of claim 1, wherein:
said substrate further comprises structure defining a hole, said structure including sidewalls and a bottom wall; and
said applying step comprises applying the composition to at least a portion of said hole sidewalls and bottom wall.

12. The method of claim 11, wherein said applying step comprises applying sufficient amounts of said composition to planarize said substrate surface.

13. The method of claim 11, wherein said structure defining a hole includes an upper boundary at said substrate surface, and said contacting step comprises removing said composition to a point below said upper boundary.

14. The method of claim 13, further comprising the step of applying an anti-reflective layer to said composition.

15. The method of claim 14, further comprising the step of applying a photoresist layer to said anti-reflective layer.

16. The method of claim 11, wherein said structure defining a hole includes an upper boundary at said substrate surface, and said contacting step comprises removing some of said composition while maintaining a layer of said composition over said substrate surface and over said upper boundary.

17. The method of claim 1, wherein:
said substrate comprises a plurality of topography features forming a dense region and an isolated region on said substrate; and
said applying step comprises applying the composition to at least some of said topography features.

18. The method of claim 17, wherein after said baking step, said composition is in the form of a layer on said topography features, said layer having a bias of less than about 20 nm.

19. The method of claim 7, wherein said polymer is a polyamic acid comprising recurring monomers having the formulas

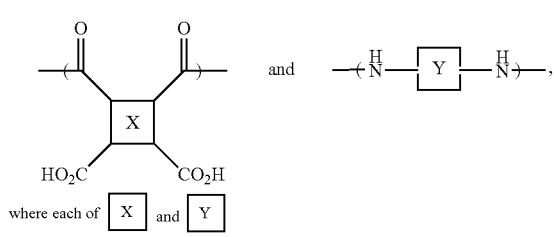

where each of X and Y is individually selected from the group consisting of aryl and aliphatic groups.

20. The method of claim 19, wherein each of X and Y is individually selected from the group consisting of substituted and unsubstituted phenyl, biphenyl, naphthyl, and anthryl groups, and substituted and unsubstituted $C_1$-$C_{12}$ aliphatic groups.

21. The method of claim 7, wherein said polymer is a polyamic acid comprising recurring monomers having a formula selected from the group consisting of

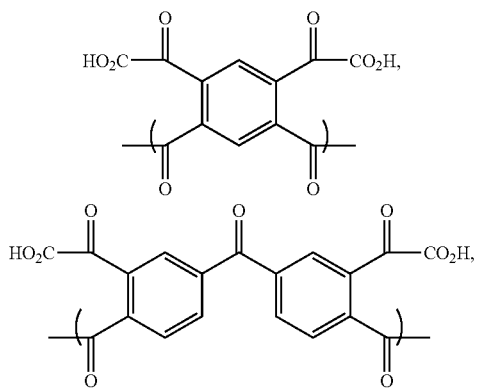

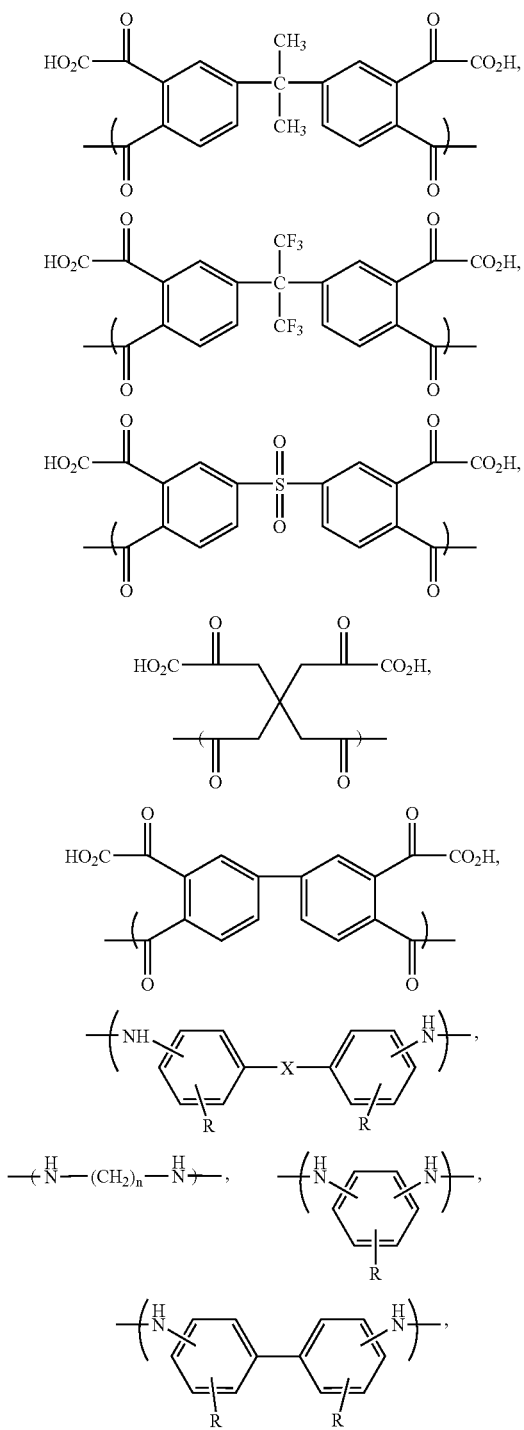

wherein:
X is selected from the group consisting of —O—, —S—, —CH$_2$—, —C(CF$_3$)$_2$—, and —C(CH$_3$)$_2$—;
n is 2-8; and
each R is individually selected from the group consisting of —H and —OH.

22. The method of claim 21, wherein said polyamic acid comprises recurring monomers having the formula

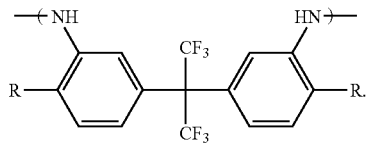

23. The method of claim 7, wherein said polymer has a pair of termini, and at least one of said termini comprises an endcap monomer having a formula other than

 (I)

and

 (II)

where each of X and Y is individually selected from the group consisting of aryl and aliphatic groups.

said endcap monomer comprising functional groups that are less reactive at room temperature than those of (I) or (II).

24. The method of claim 23, wherein said both of said termini comprise said endcap monomer.

25. The method of claim 23, wherein said endcap monomer has the formula

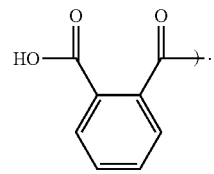

26. The method of claim 25, wherein both of said termini comprise a monomer having the formula

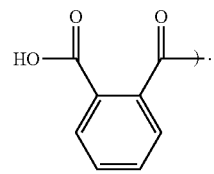

27. The method of claim 1, wherein said composition comprises a polymer, a light attenuating compound or moiety, and a crosslinking agent dissolved or dispersed in a solvent system.

28. The method of claim 27, wherein said light attenuating moiety is bonded to said polymer.

29. The method of claim 27, wherein said tight attenuating compound has a formula selected from the group consisting of

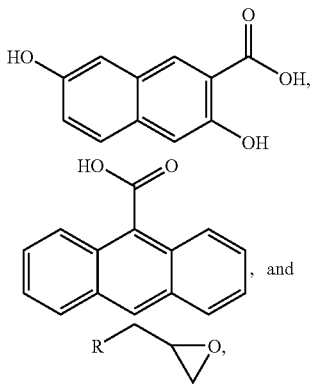

where R is selected from the group consisting of cyclic and aliphatic groups.

30. The method of claim 27, wherein said crosslinking agent is selected from the group consisting of aminoplasts, epoxies, cyanurates, and mixtures thereof.

31. The method of claim 1, further comprising the step of applying a photoresist layer to said composition.

32. The method of claim 31, further comprising the step of patterning said photoresist layer.

33. The method of claim 32, wherein said patterning step comprises exposing said photoresist layer to activating radiation and developing said exposed photoresist layer.

34. The method of claim 33, wherein said patterning step comprises forming trench patterns in said photoresist layer.

35. The method of claim 34, further comprising the step of etching a trench into said substrate.

36. The method of claim 1, wherein said composition applied to said surface portion comprises a polymer dissolved or dispersed in a solvent system.

* * * * *